(12) United States Patent
Inoue et al.

(10) Patent No.: US 11,447,398 B2
(45) Date of Patent: Sep. 20, 2022

(54) GARNET COMPOUND, SINTERED BODY AND SPUTTERING TARGET CONTAINING SAME

(71) Applicant: IDEMITSU KOSAN CO., LTD., Tokyo (JP)

(72) Inventors: Kazuyoshi Inoue, Sodegaura (JP); Shigekazu Tomai, Sodegaura (JP); Masatoshi Shibata, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 180 days.

(21) Appl. No.: 16/325,170

(22) PCT Filed: Aug. 25, 2017

(86) PCT No.: PCT/JP2017/030508
§ 371 (c)(1),
(2) Date: Feb. 12, 2019

(87) PCT Pub. No.: WO2018/043323
PCT Pub. Date: Mar. 8, 2018

(65) Prior Publication Data
US 2019/0177176 A1    Jun. 13, 2019

(30) Foreign Application Priority Data

Aug. 31, 2016 (JP) .............................. JP2016-169427
Oct. 4, 2016 (JP) .................................. 2016-196257

(51) Int. Cl.
*H01J 37/34* (2006.01)
*C01G 15/00* (2006.01)
(Continued)

(52) U.S. Cl.
CPC ........... *C01G 15/006* (2013.01); *C01G 15/00* (2013.01); *C04B 35/01* (2013.01); *C04B 35/44* (2013.01);
(Continued)

(58) Field of Classification Search
CPC ..... C23C 14/08; C23C 14/3414; C01G 15/00; C01G 15/006; C04B 35/01; C04B 35/44;
(Continued)

(56) References Cited

U.S. PATENT DOCUMENTS 3,678,479 A * 7/1972 Owens ............... G11C 19/0841
365/20
4,202,930 A * 5/1980 Kokta ..................... C04B 35/01
117/945
(Continued)

FOREIGN PATENT DOCUMENTS

| CN | 101680081 A | 3/2010 |
| CN | 102918004 A | 2/2013 |

(Continued)

OTHER PUBLICATIONS

Kawata et al. "Growth of gadolinium indium gallium garnet (GInGG) single crystal by the floating zone method", Journal of Crystal Growth, vol. 128, Issues 1-4, Part 2, Mar. 1, 1993, pp. 1011-1015. (Year: 1993).*

(Continued)

*Primary Examiner* — Rodney G McDonald
(74) *Attorney, Agent, or Firm* — Foley & Lardner LLP

(57) ABSTRACT

A garnet compound represented by a general formula (I): $Ln_3In_2Ga_{3-X}Al_XO_{12}$ (I) (in the formula, Ln represents one or more metal elements selected from La, Nd, Sm, Eu, Gd, Tb, Dy, Ho, Er, Tm, Yb and Lu; and X satisfies an expression $0 \leq X < 3$).

10 Claims, 7 Drawing Sheets

(51) Int. Cl.
*C04B 35/50* (2006.01)
*C23C 14/34* (2006.01)
*C04B 35/01* (2006.01)
*C04B 35/44* (2006.01)
*C04B 35/64* (2006.01)

(52) U.S. Cl.
CPC .............. *C04B 35/50* (2013.01); *C23C 14/34* (2013.01); *C23C 14/3414* (2013.01); *C01P 2002/72* (2013.01); *C01P 2006/10* (2013.01); *C01P 2006/40* (2013.01); *C04B 35/64* (2013.01); *C04B 2235/3217* (2013.01); *C04B 2235/3224* (2013.01); *C04B 2235/3227* (2013.01); *C04B 2235/3286* (2013.01); *C04B 2235/3293* (2013.01); *C04B 2235/6562* (2013.01); *C04B 2235/6567* (2013.01); *C04B 2235/764* (2013.01); *C04B 2235/77* (2013.01); *C04B 2235/80* (2013.01); *C04B 2235/9638* (2013.01); *H01J 37/3426* (2013.01); *H01J 37/3429* (2013.01)

(58) Field of Classification Search
CPC . C04B 35/50; C04B 35/64; C04B 2235/3217; C04B 2235/3224; C04B 2235/3227; C04B 2235/3286; C04B 2235/3293; C04B 2235/6562; C04B 2235/6567; C04B 2235/764; C04B 2235/77; C04B 2235/80; C04B 2235/9638; C01P 2002/30; C01P 2002/72; C01P 2006/10; C01P 2006/32; C01P 2006/40; H01J 37/3426; H01J 37/3429
USPC ........................................ 204/298.12, 298.13
See application file for complete search history.

(56) References Cited

U.S. PATENT DOCUMENTS

| | | | | |
|---|---|---|---|---|
| 5,691,279 | A * | 11/1997 | Tauber | H01L 39/2458 505/239 |
| 6,630,077 | B2 * | 10/2003 | Shiang | G01T 1/2023 250/363.04 |
| 8,333,913 | B2 | 12/2012 | Inoue et al. | |
| 8,668,849 | B2 | 3/2014 | Inoue et al. | |
| 9,243,318 | B2 | 1/2016 | Tomai et al. | |
| 9,767,998 | B2 | 9/2017 | Ebata et al. | |
| 10,544,363 | B2 | 1/2020 | Shibuya | |
| 2008/0260613 | A1 | 10/2008 | Ikada | |
| 2011/0315936 | A1 | 12/2011 | Inoue et al. | |
| 2012/0273777 | A1 | 11/2012 | Inoue et al. | |
| 2013/0140502 | A1 | 6/2013 | Tomai et al. | |
| 2014/0014500 | A1 | 1/2014 | Tomai et al. | |
| 2014/0252354 | A1 | 9/2014 | Ebata et al. | |
| 2016/0343554 | A1 * | 11/2016 | Tomai | H01J 37/3426 |
| 2017/0253797 | A1 | 9/2017 | Shibuya | |

FOREIGN PATENT DOCUMENTS

| | | |
|---|---|---|
| CN | 103459655 A | 12/2013 |
| CN | 103732790 A | 4/2014 |
| CN | 105873881 A | 8/2016 |
| JP | 03-237017 A | 10/1991 |
| JP | 2008-007340 A | 1/2008 |
| JP | 4860368 B2 | 1/2012 |
| KR | 10-2016-0102165 A | 8/2016 |
| TW | 201533005 A | 9/2015 |
| WO | WO-2015/098060 A1 | 7/2015 |
| WO | WO-2015/099145 A1 | 7/2015 |
| WO | WO-2016/042749 A1 | 3/2016 |

OTHER PUBLICATIONS

Japanese Office Action dated Mar. 13, 2018 in corresponding application No. 2017-562794.
Translation of the International Search Report in corresponding application No. PCT/JP2017/030508.
Translation of the Written Opinion of the International Search Authority in corresponding application No. PCT/JP2017/030508.
Office Action dated Jan. 18, 2021 for corresponding Taiwanese Patent Application No. 106129690.
Office Action dated Apr. 23, 2021, issued in a corresponding Chinese Patent Application No. 201780050211.8, (12 pages).
Xianfeng et al., "Synthesis of Garnet Gd 3 In 2 Ga 3 O 12 under High Pressure", Chinese Science Bulletin, Vo. 41, Issue 5, Mar. 15, 1996, pp. 418-421, Machine Translation, (8 pages).
Office Action dated Oct. 18, 2021 issued in a corresponding Korean Patent Application No. 10-2019-7003871, (5 pages).
Office Action issued in corresponding Taiwanese Patent Application No. 106129690 dated May 16, 2022.

* cited by examiner

GARNET COMPOUND, SINTERED BODY AND SPUTTERING TARGET CONTAINING SAME

CROSS-REFERENCE TO RELATED APPLICATIONS

The present application is a U.S. national stage application claiming the benefit of International patent application Ser. No. PCT/JP2017/030508 filed Aug. 25, 2017, which claims the benefit of priority of Japanese Patent Application No. 2016-196257, filed Oct. 4, 2016, and Japanese Patent Application No. 2016-169427, filed Aug. 31, 2016, the disclosures of which are hereby incorporated by reference.

TECHNICAL FIELD

The invention relates to a new garnet compound, a sintered body and a sputtering target containing the same.

BACKGROUND ART

An amorphous (non-crystalline) oxide semiconductor used for a thin film transistor (TFT) has higher carrier mobility, and a larger optical band gap, and can be formed into a film at a lower temperature, in comparison with general-purpose amorphous silicon (a-Si), and therefore is expected to be applied to a next-generation display requiring a large size, high resolution and high-speed drive, a resin substrate having low heat resistance, and the like.

In forming the above-described oxide semiconductor (film), a sputtering process of sputtering a sputtering target is preferably used. The reason is that a thin film formed according to the sputtering process is superior in in-plane uniformity of a component composition, a film thickness or the like in a film surface direction (inside a film surface) to a thin film formed according to an ion plating process, a vacuum vapor deposition process and an electron beam deposition process, and the thin film having the same component composition with the sputtering target can be formed.

Patent Document 1 describes a method for manufacturing a garnet compound represented by $A_3B_2C_3O_{12}$.

Moreover, Patent Document 1 describes a $Y_3In_2Ga_3O_{12}$ compound containing indium oxide as an example.

Patent Document 2 describes a sputtering target containing a compound having an $A_3B_5O_{12}$ type garnet structure obtained by sintering a raw material containing indium oxide, yttrium oxide and aluminum oxide or gallium oxide. Patent Document 2 describes that the above target contains the garnet structure, resulting in reduced electrical resistance, and reduced abnormal discharge during sputtering. Moreover, Patent Document 2 describes an application to a TFT device having high mobility.

RELATED ART DOCUMENT

Patent Documents

Patent Document 1: JP-A-2008-7340
Patent Document 2: WO2015/098060

SUMMARY OF THE INVENTION

Meanwhile, a strong desire has been expressed for a TFT having further higher performance, and a great desire is expressed for a material having high mobility, and having a small change in characteristics by heat or the like upon forming a protective film or an insulating film according to chemical vapor deposition (CVD).

An objective of the invention is to provide a new garnet compound, a sputtering target having a capability of forming a thin film exhibiting excellent TFT performance when the thin film is used for the TFT, and an oxide sintered body being a material of the sputtering target.

According to the invention, a new garnet compound, an oxide sintered body, a sputtering target and the like described below are provided.

1. A garnet compound, represented by a general formula (I):

$$Ln_3In_2Ga_{3-X}Al_XO_{12} \qquad (I)$$

wherein,
Ln represents one or more metal elements selected from La, Nd, Sm, Eu, Gd, Tb, Dy, Ho, Er, Tm, Yb and Lu; and
X satisfies an expression 0≤X<3.

2. The garnet compound according to 1, wherein Ln includes either or both of Nd and Sm.

3. An oxide sintered body, comprising a garnet phase represented by a general formula (I):

$$Ln_3In_2Ga_{3-X}Al_XO_{12} \qquad (I)$$

wherein,
Ln represents one or more metal elements selected from La, Nd, Sm, Eu, Gd, Tb, Dy, Ho, Er, Tm, Yb and Lu; and
X satisfies an expression 0≤X<3.

4. The oxide sintered body according to 3, wherein Ln includes either or both of Nd and Sm.

5. An oxide sintered body, comprising:
a garnet phase represented by a general formula (I):

$$Ln_3In_2Ga_{3-X}Al_XO_{12} \qquad (I)$$

wherein,
Ln represents one or more metal elements selected from La, Nd, Sm, Eu, Gd, Tb, Dy, Ho, Er, Tm, Yb and Lu, and X satisfies an expression 0≤X<3, and
a bixbyite phase represented by $In_2O_3$.

6. The oxide sintered body according to 5, wherein Ln includes either or both of Nd and Sm.

7. A sputtering target, prepared by using the oxide sintered body according to 5 or 6.

According to the invention, a new garnet compound, a sputtering target having a capability of forming a thin film exhibiting excellent TFT performance when the thin film is used for a thin film transistor (TFT), and an oxide sintered body being a material of the sputtering target can be provided.

MODE FOR CARRYING OUT THE INVENTION

Figure 1:
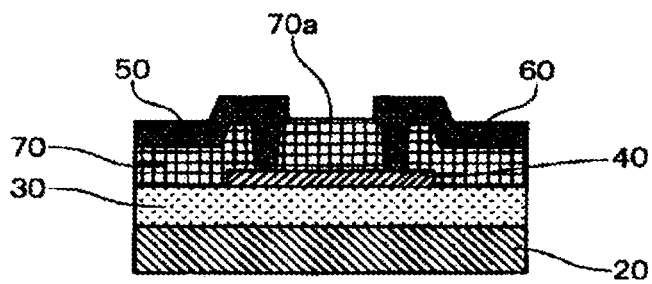
FIG. 1 shows one example of a TFT to which an oxide semiconductor thin film formed by using a sputtering target of the invention can be applied.

If an element having a large atomic radius, such as lanthanoid-based metal, is added to an indium oxide-based target material, a lattice constant of the indium oxide changes, sintered density is not increased to cause reduction of strength of the target material, a micro crack is generated by thermal stress during sputtering with large power, or chipping or abnormal discharge is caused in several cases. The above phenomena develop a defect in an oxide thin film obtained to cause deterioration of TFT performance.

In order to solve the above-described problems, the present inventors have diligently conducted search to find out a new indium oxide-based material containing a lanthanoid-based metal element, which can be used as a target material, and have found out a new garnet compound containing the lanthanoid-based metal element. Then, the present inventors have found out that a sputtering target using an oxide sintered body containing the garnet compound (garnet phase) and a bixbyite phase represented by $In_2O_3$ has characteristics advantageous as the target material, such as high sintered density, low bulk resistance, small warpage of a target and a high bonding ratio. According to the characteristics of the target, abnormal discharge is hard to be caused even by sputtering with large power, and stable sputtering can be achieved. Moreover, the present inventors have found out that a thin film obtained by sputtering the sputtering target exhibits excellent TFT performance (such as a small change in the characteristics by heat or the like upon forming a protective film or an insulating film according to chemical vapor deposition (CVD), and high-speed response) when the thin film is used for a TFT.

A garnet compound according to one embodiment of the invention (hereinafter, referred to as a garnet compound of the invention) is a new compound represented by a general formula (I):

  (I)

in the formula,

Ln represents one or more metal elements selected from La, Nd, Sm, Eu, Gd, Tb, Dy, Ho, Er, Tm, Yb and Lu; and X satisfies an expression $0 \leq X < 3$.

In the invention, a term "garnet compound" means a compound having a crystal structure type of a garnet structure (garnet type structure).

Ln in the formula (I) is one or more metal elements selected from lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu). Among the above elements, Sm or Nd is preferred.

Ln preferably includes either or both of Nd and Sm, and is more preferably either of Nd and Sm.

The garnet compound of the invention may have a single crystal structure or a polycrystal structure.

An oxide sintered body according to one embodiment of the invention (hereinafter, referred to as a first oxide sintered body of the invention) is a new material, characterized by including a garnet phase represented by a general formula (I):

  (I)

in the formula,

Ln represents one or more metal elements selected from La, Nd, Sm, Eu, Gd, Tb, Dy, Ho, Er, Tm, Yb and Lu; and X satisfies an expression $0 \leq X < 3$.

The oxide sintered body may consist essentially of the above-described new garnet compound (garnet phase), or may include a compound (phase) other than the above-described new garnet compound (garnet phase).

An oxide sintered body according to one embodiment of the invention (hereinafter, referred to as a second oxide sintered body of the invention) is a new material, characterized by including a garnet phase represented by a general formula (I):

  (I)

in the formula,

Ln represents one or more metal elements selected from La, Nd, Sm, Eu, Gd, Tb, Dy, Ho, Er, Tm, Yb and Lu; and X satisfies an expression $0 \leq X < 3$, and a bixbyite phase represented by $In_2O_3$.

The first oxide sintered body of the invention and the second oxide sintered body of the invention as described above are collectively referred to the oxide sintered body of the invention in several cases.

Ln in the garnet phase represented by the general formula (I) in the oxide sintered body of the invention preferably includes either or both of Nd and Sm, and is more preferably either of Nd and Sm.

A sputtering target according to one embodiment of the invention (hereinafter, referred to as a sputtering target of the invention) is characterized by having the above-described second oxide sintered body of the invention.

The sputtering target of the invention is manufactured by laminating the second oxide sintered body of the invention to a backing plate, as the target material. A method for manufacturing the sputtering target will be described later.

The second oxide sintered body of the invention includes the garnet phase represented by the general formula (I), and the bixbyite phase represented by $In_2O_3$ as described above. Thus, sintered density (relative density) and volume resistivity (bulk resistance) can be improved. Moreover, a coefficient of linear expansion can be reduced and thermal conductivity can be increased. Moreover, even when a raw material is calcined under special conditions such as an oxygen atmosphere using an atmospheric calcination furnace, or according to such a simple method as performing the calcination under the atmosphere, the oxide sintered body having low volume resistivity and high sintered body density can be formed. The second oxide sintered body of the invention, having the above-described characteristics, is preferred as the target material.

The strength of the target is high by using the second oxide sintered body of the invention as the target material. Moreover, the thermal conductivity is high and the coefficient of linear expansion is small, and therefore the thermal stress can be suppressed. As a result, the sputtering target capable of suppressing generation of the micro crack or chipping of the target, and suppressing generation of a nodule or the abnormal discharge, and capable of sputtering with large power can be obtained.

In addition thereto, a high performance TFT can be obtained by using the second oxide sintered body of the invention as the target material, in which the TFT has high mobility, and small deterioration of characteristics by heat in a chemical vapor deposition process (CVD process) performed after lamination of an oxide semiconductor layer in the course of a TFT manufacturing process, or heat treatment after TFT preparation, and the like.

The garnet compound of the invention, and the garnet phase and the bixbyite phase represented by $In_2O_3$ in the oxide sintered body can be detected from an XRD chart according to an X-ray diffraction (XRD) method, for example.

An abundance ratio of the bixbyite phase represented by $In_2O_3$ in the second oxide sintered body of the invention is preferably 1 to 99 wt %, and more preferably 10 to 98 wt %. If the abundance ratio of the bixbyite phase represented by $In_2O_3$ is in the above-described range, $Ln_3In_2(Ga_{3-x}Al_x)_3O_{12}$ being the new compound is dispersed in $In_2O_3$ crystals, and an application to a fluorescence material other than the target material or the like as described later can also be considered by further doping a rare earth element thereinto or the like.

In the oxide sintered body used for the sputtering target of the invention, the bixbyite phase represented by $In_2O_3$ is preferably a main component. If a crystal structure other than a bixbyite structure precipitates as the main component, reduction of the mobility is liable to be caused. An expression "bixbyite phase represented by $In_2O_3$ is the main component" means that the abundance ratio of the bixbyite phase represented by $In_2O_3$ is more than 50 wt %, in which the abundance ratio is preferably 70 wt % or more, more preferably 80 wt % or more, and further preferably 90 wt % or more.

In the oxide sintered body used for the sputtering target of the invention, the sintered density is preferably within the range of 6.5 to 7.1 g/cm³, and more preferably within the range of 6.6 to 7.1 g/cm³. If the sintered density is within the range of 6.5 to 7.1 g/cm³, a space causing the abnormal discharge or serving as a starting point of generation of the nodule can be reduced upon using the oxide sintered body as the target.

The sintered density can be measured according to an Archimedes method, for example.

In the oxide sintered body used for the sputtering target of the invention, one or more metal elements represented by the Ln (La, Nd, Sm, Eu, Gd, Tb, Dy, Ho, Er, Tm, Yb and Lu; hereinafter, represented as "Ln"), an Al element and a Ga element may form solid solution with the bixbyite phase represented by $In_2O_3$. Ln and Ga, or Ln, Ga and Al preferably form the solid solution therewith. The solid solution is preferably substitutional solid solution.

Accordingly, stable sputtering can be performed.

The solid solution of Ln and Ga, or Ln, Ga and Al can be identified from a lattice constant of the bixbyite phase by using measurement of XRD, for example.

For example, if the lattice constant of the bixbyite phase represented by $In_2O_3$ is smaller than a lattice constant of only the bixbyite phase represented by $In_2O_3$, the solid solution of Ga, or Ga and Al dominantly acts thereon, and if the lattice constant of the bixbyite phase represented by $In_2O_3$ is larger than the lattice constant of only the bixbyite phase represented by $In_2O_3$, the solid solution of Ln dominantly acts thereon.

Here, a term "lattice constant" is defined as a length of a lattice axis of a unit lattice, and can be determined according to the X-ray diffraction method, for example.

Moreover, in the oxide sintered body used for the sputtering target of the invention, Ln and Ga, or Ln, Ga and Al may form the solid solution with the garnet phase represented by the general formula (I).

Accordingly, stable sputtering can be performed.

In the oxide sintered body used for the sputtering target of the invention, a mean particle size of the garnet phase represented by the general formula (I) is preferably 15 µm or less, more preferably 10 µm or less, further preferably 8 µm or less, and particularly preferably 5 µm or less. A lower limit is not particularly limited, but is ordinarily 0.1 µm or more.

When the mean particle size of the garnet phase represented by the general formula (I) is 15 µm or less, discharge is easily stabilized.

The mean particle size of the garnet phase represented by the general formula (I) can be determined by identifying the garnet phase represented by the general formula (I) by means of an electron probe microanalyzer (EPMA), assuming a circle having a maximum diameter thereof as a diameter, and being taken as a mean value of the diameters, for example.

In the oxide sintered body used for the sputtering target of the invention, an atomic ratio: In/(In +Ln+Ga+Al) is preferably 0.60 or more and 0.97 or less, more preferably 0.70 or more and 0.96 or less, and further preferably 0.75 or more and 0.95 or less.

When the atomic ratio is less than 0.60, the mobility of the TFT including an oxide semiconductor thin film to be formed is liable to be reduced. When the atomic ratio is more than 0.97, stability of the TFT is liable to be unable to be obtained, or the TFT is conducted, and is liable to be hard to form a semiconductor.

In the oxide sintered body used for the sputtering target of the invention, an atomic ratio: (Ga+Al)/(In+Ln+Ga+Al) when Al is included therein is preferably 0.01 or more and 0.20 or less, more preferably 0.02 or more and 0.15 or less, and further preferably 0.02 or more and 0.12 or less.

When the atomic ratio: (Ga+Al)/(In+Ln+Ga+Al) is less than 0.01, the garnet phase represented by the general formula (I) is not formed, the bulk resistance of the oxide sintered body may be increased, the sintered density and sintered body strength may be reduced, and therefore cracking or the like by heat during sputtering is liable to be easily caused, or stable sputtering is liable to be unable to be performed. On the other hand, when the atomic ratio is more than 0.20, the mobility of the TFT including the oxide semiconductor thin film to be formed is liable to be reduced.

In the oxide sintered body used for the sputtering target of the invention, an atomic ratio: Ga/(In+Ln+Ga) when Al is not included therein is preferably 0.01 or more and 0.40 or less.

In the oxide sintered body of the invention and the oxide sintered body used for the sputtering target of the invention, an atomic ratio: Ln/(In+Ln+Ga+Al) is preferably 0.02 or more and 0.20 or less, more preferably 0.02 or more and 0.18 or less, and further preferably 0.03 or more and 0.16 or less.

When the atomic ratio is less than 0.02, the garnet phase represented by the general formula (I) is not formed, the bulk resistance of the oxide sintered body may be increased, the sintered density and the sintered body strength may be reduced, and therefore the cracking or the like by heat during sputtering is liable to be easily caused, or stable sputtering is liable to be unable to be performed. On the other hand, when the atomic ratio is more than 0.20, the mobility of the TFT including the oxide semiconductor thin film to be formed is liable to be reduced.

Moreover, the oxide sintered body of the invention and the oxide sintered body used for the sputtering target of the invention may further include a positive tetravalent metal element.

The oxide sintered body of the invention and the oxide sintered body used for the sputtering target of the invention preferably include the positive tetravalent metal element.

Accordingly, sputtering can be further stably performed.

Specific examples of the positive tetravalent metal element include Si, Ge, Sn, Ti, Zr, Hf and Ce, and Sn is preferred. The bulk resistance is reduced by a doping effect of Sn, and sputtering can be further stably performed.

In the oxide sintered body used for the sputtering target of the invention, the positive tetravalent metal element preferably forms the solid solution with the bixbyite phase represented by $In_2O_3$ or the garnet phase represented by the general formula (I), and more preferably forms the solid solution with the bixbyite phase represented by $In_2O_3$. The solid solution is preferably substitutional solid solution.

Accordingly, sputtering can be further stably performed.

The solid solution of the positive tetravalent metal element can be identified from the lattice constant in the measurement of XRD, for example.

Moreover, with regard to the bixbyite phase represented by $In_2O_3$ with which the positive tetravalent metal element forms the solid solution, the solid solution with Ln and Ga, or Ln, Ga and Al can be identified from the lattice constant of the bixbyite phase by using the measurement of XRD in a manner similar to the solid solution with the bixbyite phase represented by $In_2O_3$ described above, for example.

In the oxide sintered body used for the sputtering target of the invention, a content of the positive tetravalent metal element is preferably 100 to 10,000 ppm, more preferably 500 ppm or more and 8000 ppm or less, and further preferably 800 ppm or more and 6000 ppm or less, in terms of an atom concentration, based on all metal elements in the oxide sintered body.

When the content thereof is less than 100 ppm, the bulk resistance is liable to be increased. On the other hand, when the content thereof is more than 10,000 ppm, the TFT including the oxide semiconductor thin film to be formed is liable to be conducted or an ON/OFF value is liable to be decreased.

In the oxide sintered body used for the sputtering target of the invention, the bulk resistance is preferably 30 mΩ·cm or less, more preferably 15 mΩ·cm or less, and further preferably 10 mΩ·cm or less. A lower limit is not particularly limited, but is ordinarily 1 mΩ·cm or more or 5 mΩ·cm or more.

When the bulk resistance thereof is 30 mΩ·cm or less, the abnormal discharge by charging of the target is hard to be generated during film formation with large power, and a plasma state is stabilized, and spark becomes hard to be generated. Moreover, when a pulse DC sputtering device is used, plasma is further stabilized, and a problem of the abnormal discharge or the like is also not caused, and sputtering can be stably performed.

The bulk resistance can be measured on the basis of a four-point probe array, for example.

In the oxide sintered body used for the sputtering target of the invention, three point flexural strength is preferably 120 MPa or more, more preferably 140 MPa or more, and further preferably 150 MPa or more.

An upper limit is not particularly limited, but is ordinarily 200 MPa or less.

When the three point flexural strength is less than 120 MPa, strength of the target is low upon performing film formation by sputtering with large power, and the target may be cracked or chipped, and chipped fragments may be scattered on the target, which is liable to cause the abnormal discharge.

The three point flexural strength can be tested in accordance with JIS R 1601 "Testing method for flexural strength (modulus of rupture) of fine ceramics at room temperature", for example.

Specifically, the flexural strength can be calculated from a maximum load when a test piece is broken by using a standard test piece having a width of 4 mm, a thickness of 3 mm and a length of 40 mm, placing the test piece on two supporting points arranged at a predetermined distance (30 mm), and applying a load from a center between the supporting points at a crosshead speed of 0.5 mm/min.

In the oxide sintered body used for the sputtering target of the invention, the coefficient of linear expansion is preferably $8.0 \times 10^{-6}$ $K^{-1}$ or less, more preferably $7.5 \times 10^{-6}$ $K^{-1}$ or less, and further preferably $7.0 \times 10^{-6}$ $K^{-1}$ or less. A lower limit is not particularly limited, but is ordinarily $5.0 \times 10^{-6}$ $K^{-1}$ or more.

When the coefficient of linear expansion thereof is more than $8.0 \times 10^{-6}$ $K^{-1}$, the target is heated during sputtering with large power, and the micro crack may be caused by stress in the target, or cracking or chipping is liable to cause the abnormal discharge.

The coefficient of linear expansion can be determined by using a standard test piece having a width of 5 mm, a thickness of 5 mm and a length of 10 mm, setting a heating rate to 5° C./min, and detecting deflection by thermal expansion when temperature reaches 300° C. by means of a position detector, for example.

In the oxide sintered body used for the sputtering target of the invention, the thermal conductivity is preferably 5.0 W/m·K or more, more preferably 5.5 W/m·K or more, further preferably 6.0 W/m·K or more, and most preferably 6.5 W/m·K or more.

An upper limit is not particularly limited, but is ordinarily 10 W/m·K or less.

When the thermal conductivity thereof is less than 5.0 W/m·K, a temperature on a sputtered surface is different from a temperature on a bonded surface upon performing film formation by sputtering with large power, and the micro crack, cracking or chipping is liable to be caused by internal stress in the target.

The thermal conductivity can be calculated by using a standard test piece having a diameter of 10 mm and a thickness of 1 mm, and determining, according to a laser flash method, specific heat capacity and thermal diffusivity, and multiplying the resulting values by density of the test piece, for example.

The metal elements of the oxide sintered body used for the sputtering target of the invention are substantially composed of In, Ln, Ga and arbitrarily Sn, or substantially composed of In, Ln, Ga, Al and arbitrarily Sn, and may include inevitable impurities in addition thereto in the range in which an effect of the sputtering target of the invention is not adversely affected.

For example, the metal elements of the oxide sintered body used for the sputtering target of the invention may be composed of In, Ln and Ga, or In, Ln, Ga and Al, or In, Ln, Ga and Sn, or In, Ln, Ga, Al and Sn in 90 atom % or more, 95 atom % or more, 98 atom % or more, 99 atom % or more or 100 atom % of the metal elements of the oxide sintered body used for the sputtering target of the invention.

The garnet compound of the invention and the oxide sintered body of the invention can be manufactured through a step of preparing mixed powder of raw material powder including indium, raw material powder including a Ln element in the general formula (I) described above and raw material powder including Ga, or mixed powder of raw material powder including indium, raw material powder including the Ln element in the general formula (I) described above, raw material powder including Ga and raw material powder including Al, a step of molding the mixed powder to manufacture a molded body, and a step of calcining the molded body. Specifically, the garnet compound of the invention and the oxide sintered body of the invention may be manufactured according to a method shown in Examples.

The raw material powder is preferably oxide powder.

A mixing ratio of the raw material powder only needs to be allowed to correspond to an atomic ratio of the oxide sintered body tried to be obtained, for example.

Further, when the oxide sintered body including the above-described arbitrary component such as Sn is manufactured, raw material powder including the above-described arbitrary component such as Sn may be added to the mixed powder.

A mean particle size of the raw material powder is preferably 0.1 to 1.2 μm, and more preferably 0.5 to 1.0 μm or less. The mean particle size of the raw material powder can be measured by a laser diffraction particle size distribution device or the like.

A method for mixing or molding the raw materials is not particularly limited, and mixing or molding can be performed by using a publicly-known method. For example, an aqueous solvent is blended to the mixed raw material powder, and the resulting raw material powder slurry is mixed for 12 hours or more, and then the resulting material is subjected to solid liquid separation, drying and granulation, and subsequently the resulting granulated material is put into a template and molded.

Mixing can be made by using a ball mill according to a wet type or dry type, a vibrating mill, a bead mill or the like.

A mixing time by using the ball mill is preferably 15 hours or more, and more preferably 19 hours or more.

Moreover, upon mixing the raw materials, a binder is added thereto by an arbitrary amount, and the resultant mixture is preferably mixed simultaneously. As the binder, polyvinyl alcohol, vinyl acetate or the like can be used.

Next, granulated powder is obtained from the raw material powder slurry. Upon granulation, spray-dry or freeze-dry is preferably performed, and the spray-dry is more preferably performed.

The resulting mixed powder (granulated powder) can be press-molded into the molded body. According to the above step, the mixed powder can be molded into a shape of a product (for example, the shape preferable as the sputtering target).

Specifically, the molded body is obtained by filling the granulated powder into a mold such as a rubber mold, and molding the granulated powder at a pressure of 100 MPa or more, for example, by ordinarily using a mold press or a cold isostatic press (CIP).

The oxide sintered body can be obtained by sintering the molded body obtained at a sintering temperature of 1200 to 1650° C. for 10 hours or more.

The sintering temperature is preferably 1350 to 1600° C., more preferably 1400 to 1600° C., and further preferably 1450 to 1600° C. A sintering time is preferably 10 to 50 hours, more preferably 12 to 40 hours, and further preferably 13 to 30 hours.

If the sintering temperature is less than 1200° C. or the sintering time is less than 10 hours, sintering does not sufficiently progress, and therefore electrical resistance of the target is not sufficiently reduced, and is liable to cause the abnormal discharge. On the other hand, if the sintering temperature is more than 1650° C. or the sintering time is more than 50 hours, a mean crystal grain size may be increased by remarkable crystal grain growth or coarse pores may be generated, which is liable to cause reduction of the sintered body strength, or the abnormal discharge.

As a sintering method used in the invention, in addition to an atmospheric sintering process, a pressure sintering process such as a hot press, oxygen pressing and hot isotropic pressing can also be adopted.

In the atmospheric-pressure sintering process, the molded body is sintered in the atmosphere or an oxidizing gas atmosphere, and preferably in the oxidizing gas atmosphere. The oxidizing gas atmosphere preferably means an oxygen gas atmosphere. The oxygen gas atmosphere is preferably an atmosphere in which an oxygen concentration is 10 to 100% by volume, for example. In the method for manufacturing the above-described oxide sintered body, sintered body density can be further increased by introducing the oxygen gas atmosphere into a heating process.

Further, the heating rate upon sintering the molded body is preferably adjusted to 0.1 to 2° C./min from 800° C. to the sintering temperature (1200 to 1650° C.).

In the oxide sintered body of the invention, a temperature range from 800° C. or more is a range in which sintering progresses most. If the heating rate in the above temperature range becomes lower than 0.1° C./min, crystal grain growth becomes remarkable, and high density is liable to be unable to be achieved. On the other hand, if the heating rate becomes higher than 2° C./min, a temperature distribution is caused in the molded body, and the oxide sintered body is liable to be warped or cracked.

The heating rate from 800° C. to the sintering temperature is preferably 0.1 to 1.3° C./min, and more preferably 0.1 to 1.1° C./min.

The sputtering target of the invention can be obtained by cutting and polishing the second oxide sintered body of the invention described above, and bonding a target member processed into a plate shape, a cylindrical shape, a half-cylindrical shape or the like to a backing plate (target support) formed of a cupper plate or the like and having a plate shape or a cylindrical shape by using metal indium or the like.

For example, a sintered portion in a highly oxidized state or an uneven surface on a surface of the oxide sintered body can be removed by cutting the oxide sintered body. Moreover, the sputtering target can be processed into a specified size.

The surface may be polished with Buff #200 or #400 and further #800. Accordingly, abnormal discharge or generation of particles during sputtering can be suppressed.

Specific examples of a bonding method include bonding by metal indium.

In order to keep cooling efficiency during sputtering, the bonding ratio is adjusted to preferably 90% or more, more preferably 95% or more, and further preferably 99% or more. The bonding ratio herein means a ratio of an area of a surface on which the target member and the target support are bonded through a bonding layer to an area of a surface on which the target member and the target support are overlapped with each other. The bonding ratio can be ordinarily measured with ultrasonic testing equipment or the like.

A method for bonding the target member and the target support will be described.

Surface treatment is applied to a bonding surface with the target support in the target member processed into a predetermined shape. As a device used for the surface treatment, a generally commercially available blast device can be used. Specific examples of the device include a trade name "PNEUMA-BLASTER SFG-5-B" made by Fuji Manufacturing Co., Ltd. As powder used for a blasting process, glass, alumina, zirconia, SiC or the like can be used, and the above materials are appropriately selected according to a composition, hardness or the like of the target member.

A surface-treated surface of the target member obtained is washed when necessary, and then a bonding material such as metal indium solder is applied to the bonding surface. Similarly, the bonding material such as the metal indium solder is applied to a bonding surface of the backing plate subjected to washing treatment, when necessary. On the occasion, when the target member is composed of a material that is not directly welded to the bonding material, a thin film layer of copper, nickel or the like excellent in wettability with the bonding material is previously formed on the bonding surface of the target member according to a sputtering process, a plating process or the like, and then the target member is heated to a level equal to or higher than a melting point of the bonding material to be used, and then the bonding material is applied to the bonding surface, or the bonding material may be directly applied to the bonding surface of the target member by using ultrasonic waves.

Next, the target support to which the bonding material is applied is heated to the level equal to or higher than the melting point of the bonding material used to melt a bonding material layer on the surface, and then the powder described above is arranged on the surface, and the target member is bonded to the target support, and then the resulting material is cooled to room temperature, and thus the sputtering target can be obtained.

The sputtering target of the invention can be applied to a direct current (DC) sputtering process, a radio frequency (RF) sputtering process, an alternating current (AC) sputtering process, a pulse DC sputtering process or the like.

The oxide semiconductor thin film can be obtained without causing the abnormal discharge or the like by forming the film by using the above-described sputtering target of the invention.

The oxide semiconductor thin film formed by using the above-described sputtering target of the invention can be preferably used as a channel layer of the TFT, for example, and when the thin film is used for the TFT, excellent TFT performance is developed.

A device configuration of the TFT in which the above-described oxide semiconductor thin film is used is not particularly limited, and various publicly-known device configurations can be adopted.

The TFT obtained can be used for electronic equipment of a display unit such as a liquid crystal display and an organic electroluminescence display, for example.

FIG. 1 shows one example of the TFT to which the oxide semiconductor thin film formed by using the sputtering target of the invention can be applied. In the TFT, an oxide semiconductor thin film 40 obtained by using the sputtering target of the invention is formed on a gate insulating film 30 on a silicon wafer (gate electrode) 20, and interlayer insulating films 70 and 70a are formed thereon. The interlayer insulating film 70a on the oxide semiconductor thin film 40 acts also as a channel layer protective layer. A source electrode 50 and a drain electrode 60 are provided on the oxide semiconductor thin film.

Figure 2:
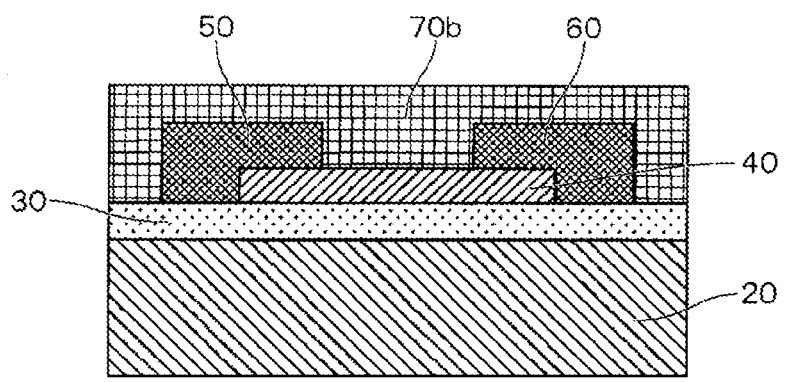
FIG. 2 shows another example of a TFT to which an oxide semiconductor thin film formed by using a sputtering target of the invention can be applied.

FIG. 2 shows another example of the TFT to which the oxide semiconductor thin film formed by using the sputtering target of the invention can be applied. In the TFT, an oxide semiconductor thin film 40 obtained by using the sputtering target of the invention is formed on a gate insulating film (for example, $SiO_2$) 30 on a silicon wafer (gate electrode) 20, and a source electrode 50 and a drain electrode 60 are provided on the oxide semiconductor thin film 40, and a protective layer 70b (for example, a $SiO_2$ film formed according to CVD) is provided on the oxide semiconductor thin film 40, the source electrode 50 and the drain electrode 60.

With regard to the silicon wafer 20 and the gate insulating film 30, the silicon wafer may be applied as the gate electrode by using a silicon wafer with a thermal oxide film, and the thermal oxide film ($SiO_2$) may be applied as the gate insulating film.

Moreover, in FIG. 1 and FIG. 2, the gate electrode 20 may be formed on a substrate such as glass.

In the oxide semiconductor thin film, a band gap is preferably 3.0 eV or more. When the band gap is 3.0 eV or more, the oxide semiconductor thin film does not absorb light having a wavelength on side of a longer wavelength from about 420 nm. Accordingly, the oxide semiconductor thin film does not absorb light from a light source of an organic EL or a TFT-LCD, and upon being used as the channel layer of the TFT, malfunction of the TFT by light or the like is not caused, and light stability can be improved. The band gap is preferably 3.1 eV or more, and more preferably 3.3 eV or more.

In the TFT to which the oxide semiconductor thin film formed by using the sputtering target of the invention can be applied, a material forming each electrode of the drain electrode, the source electrode and the gate electrode is not particularly limited, and the material generally used can be arbitrarily selected. For example, a transparent electrode formed of indium tin oxide (ITO), indium zinc oxide (IZO), ZnO, $SnO_2$ or the like, a metal electrode formed of Al, Ag, Cu, Cr, Ni, Mo, Au, Ti, Ta or the like, or a metal electrode or a laminated electrode of alloy containing the above materials can be used. Moreover, the silicon wafer may be used as the substrate, and in the case, the silicon wafer acts also as the electrode.

In the TFT to which the oxide semiconductor thin film formed by using the sputtering target of the invention can be applied, in the case of a TFT of a back channel etch type (bottom gate type), the protective film is preferably provided on the drain electrode, the source electrode and the channel layer. Durability is easily improved by providing the protective film thereon even when the TFT is driven for a long period of time. In addition, in the case of a TFT of a top gate type, the TFT is formed into a structure in which the gate insulating film is formed on the channel layer, for example.

The protective film or the insulating film can be formed according to CVD, for example, and on the occasion, a process by a high temperature is applied in several cases. Moreover, the protective film or the insulating film includes impurity gas immediately after film formation in many cases, and heat treatment (annealing treatment) is preferably performed. A stable protective film or insulating film is formed by removing the impurity gas by the heat treatment, and a TFT device having high durability is easily formed.

The TFT becomes less susceptible to temperature in the CVD process and the heat treatment thereafter by using the oxide semiconductor thin film formed by using the sputtering target of the invention, and therefore even when the protective film or the insulating film is formed, stability of characteristic of the TFT can be improved.

EXAMPLES

Hereinafter, the invention will be described more specifically by way of Examples, but the invention is not limited to the Examples described below, and can also be carried out by suitably adding modifications in the range adaptable to the gist of the invention, and all the modifications are included in the technical scope of the invention.

Examples 1 to 5

[Manufacture of Oxide Sintered Body]

Lanthanoid-based oxide powder, indium oxide powder, aluminum oxide powder and gallium oxide powder were weighed to be in a ratio shown in Table 1, put in a pot made of polyethylene, and mixed and milled for 72 hours by using a dry ball mill to prepare mixed powder.

The resulting mixed powder was put in a mold and formed into a press-molded body at a pressure of 500 kg/cm². The resulting molded body was densified at a pressure of 2000 kg/cm² by CIP. Next, the resulting molded body was placed in an atmospheric calcination furnace, and held at 350° C. for 3 hours under the atmosphere, and then heated at 50° C./hour, and sintered at 1450° C. for 20 hours, and then cooled by being left to stand to obtain an oxide sintered body.

(Evaluation of Characteristics of Oxide Sintered Body)
(1) Measurement of XRD

X-ray diffraction (XRD) of the oxide sintered body was measured on the oxide sintered body obtained by means of X-ray Diffractometer Smartlab under the following conditions. An XRD chart obtained was analyzed according to X-ray powder diffraction pattern full-featured analytical software JADE 6 (made by Rigaku Corporation) to determine a crystalline phase in the oxide sintered body. The results are shown in Table 1.

Diffractometer: Smartlab (made by Rigaku Corporation)

X-rays: Cu-Kα rays (wavelength: 1.5418 Å, monochromatized by a graphite monochromator)

2θ-θ reflection method, serial scan (2.0°/min)

Sampling interval: 0.02°

Slit DS (divergence slit), SS (scattering slit), RS (receiving slit): 1.0 mm

XRD charts of the oxide sintered bodies obtained in Examples 1 to 7 are shown in FIGS. 3 to 7, respectively.

From FIGS. 3 to 7, the oxide sintered body obtained in each Example was found to have a garnet phase, or the garnet phase and a bixbyite phase as shown in Table 1.

(2) An abundance ratio (wt %) of $In_2O_3$ was determined on the oxide sintered body obtained as the abundance ratio of $In_2O_3$ from the XRD chart according to a whole pattern fitting (WPF) method. The results are shown in Table 1.

(3) Sintered density (g/cm³) was measured, on the oxide sintered body obtained, according to an Archimedes method. The results are shown in Table 1.

TABLE 1

Figure 3:
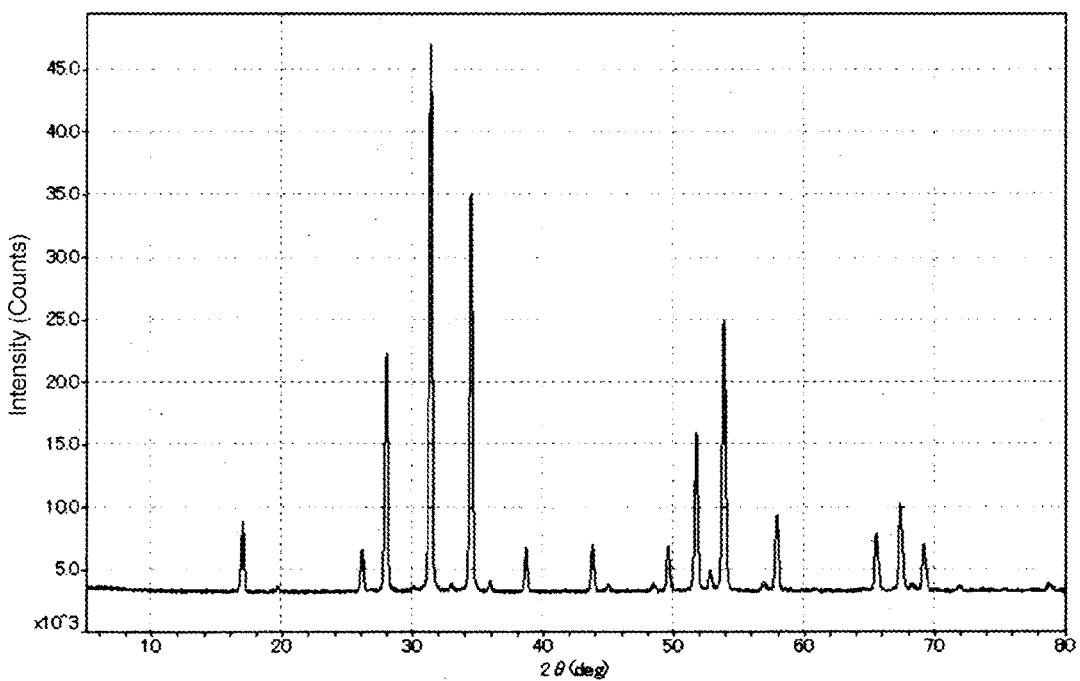
FIG. 3 is an X-ray diffraction pattern of an oxide sintered body in Example 1.
Figure 4:
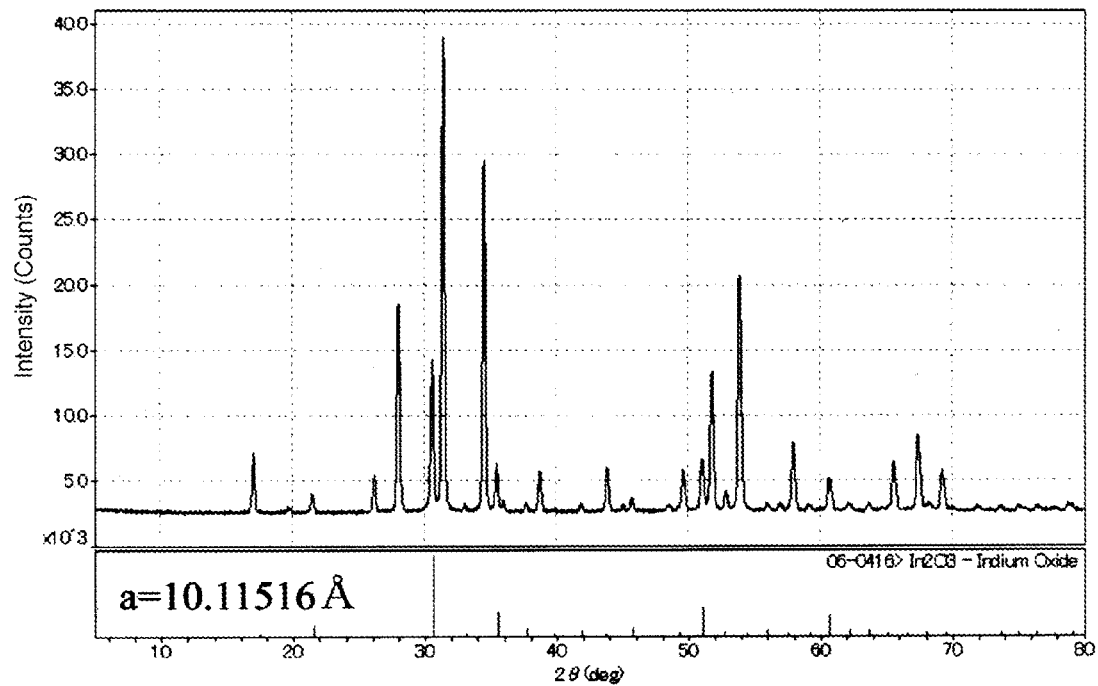
FIG. 4 is an X-ray diffraction pattern of an oxide sintered body in Example 2.
Figure 5:
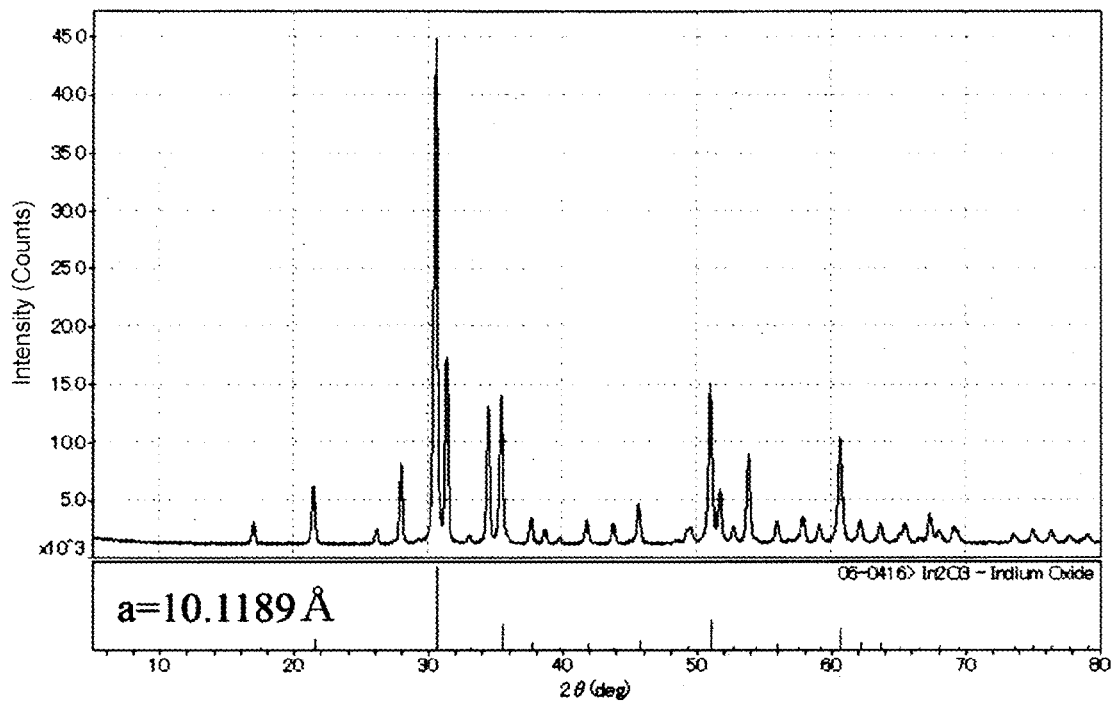
FIG. 5 is an X-ray diffraction pattern of an oxide sintered body in Example 3.
Figure 6:
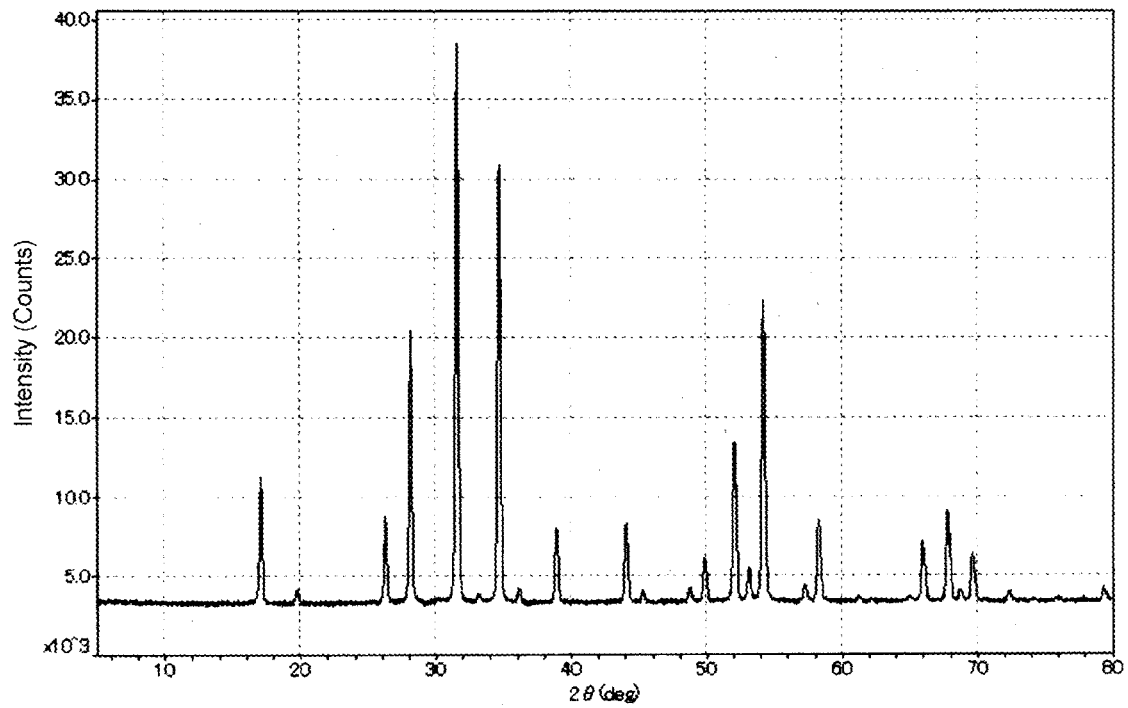
FIG. 6 is an X-ray diffraction pattern of an oxide sintered body in Example 4.
Figure 7:
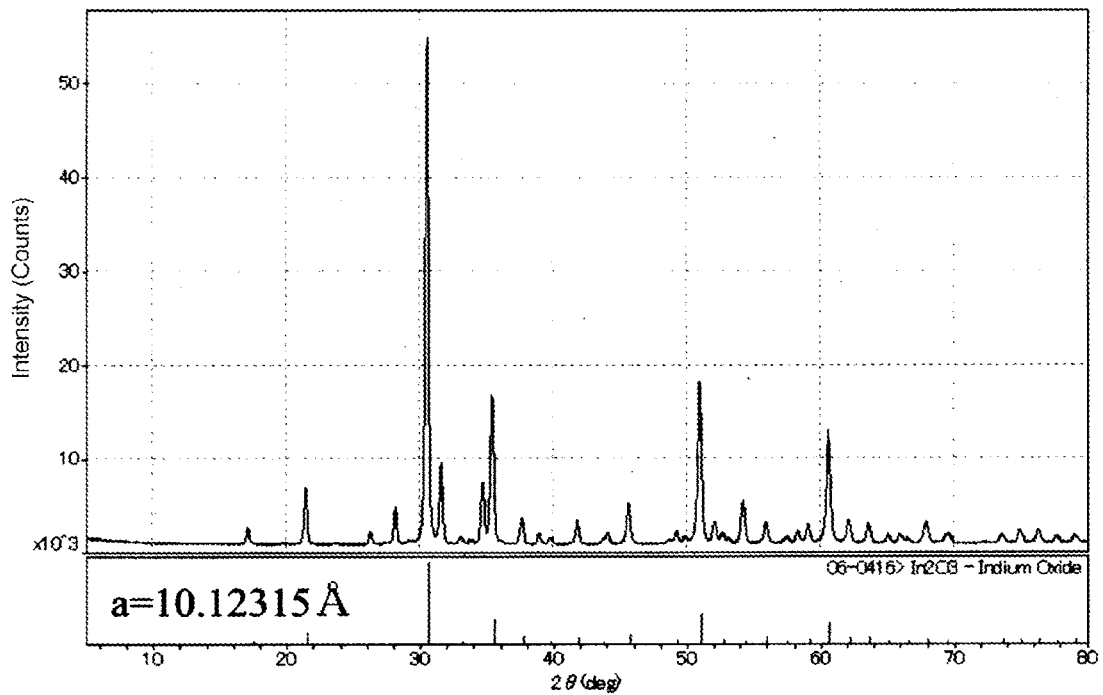
FIG. 7 is an X-ray diffraction pattern of an oxide sintered body in Example 5.

| | | Example 1 | Example 2 | Example 3 | Example 4 | Example 5 |
|---|---|---|---|---|---|---|
| Weight ratio of oxide (wt %) | Indium oxide | 25.6 | 37.0 | 70.8 | 27.3 | 81.7 |
| | Aluminum oxide | 0.0 | 0.0 | 0.0 | 7.5 | 1.9 |
| | Gallium oxide | 26.0 | 22.0 | 10.2 | 13.8 | 3.5 |
| | Samarium oxide | 48.4 | 41.0 | 19.0 | 51.4 | 12.9 |
| | Tin oxide | 0.0 | 0.0 | 0.0 | 0.0 | 0.0 |
| Metal atomic ratio in oxide sintered body (at %) | In/(In + Al + Ga + Sm + Sn) | 25.0 | 36.2 | 70.0 | 25.0 | 79.8 |
| | Al/(In + Al + Ga + Sm + Sn) | 0.0 | 0.0 | 0.0 | 18.7 | 5.1 |
| | Ga/(In + Al + Ga + Sm + Sn) | 37.5 | 31.9 | 15.0 | 18.8 | 5.1 |
| | Sm/(In + Al + Ga + Sm + Sn) | 37.5 | 31.9 | 15.0 | 37.5 | 10.0 |
| | Sn/(In + Al + Ga + Sm + Sn) | 0.0 | 0.0 | 0.0 | 0.0 | 0.0 |
| Characteristics of oxide sintered body | XRD data | FIG. 3 | FIG. 4 | FIG. 5 | FIG. 6 | FIG. 7 |
| | Crystalline phase in oxide sintered body (a = lattice constant Å) | $Sm_3In_2Ga_3O_{12}$ (a = 12.55729) | $Sm_3In_2Ga_3O_{12}$ + $In_2O_3$ | $Sm_3In_2Ga_3O_{12}$ + $In_2O_3$ | $Sm_3In_2Al_{1.5}Ga_{1.5}O_{12}$ (a = 12.65073) | $Sm_3In_2Al_{1.5}Ga_{1.5}O_{12}$ + $In_2O_3$ |
| | $In_2O_3$ abundance ratio (wt %) | 0 | 18.9 | 69.2 | 0 | 82.8 |
| | Sintered density (g/cm³) | 4.08 | 4.39 | 5.87 | 4.24 | 6.36 |

XRD charts in Example 1 and Example 4 show peaks which do not reside in JCPDS cards, and the oxide sintered bodies are considered to be new compounds, and were identified as $Sm_3In_2Ga_3O_{12}$ and $Sm_3In_2AL_{1.5}Ga_{1.5}O_{12}$, respectively, from atomic composition ratios, comparison with similar XRD patterns or structural analysis of XRD patterns obtained.

[Manufacture of Sputtering Target]

Examples 6 to 8

An oxide sintered body was manufactured and evaluated in the same manner as in Examples 1 to 5 except that raw material oxides were mixed at a ratio shown in Table 2 below.

Figure 8:
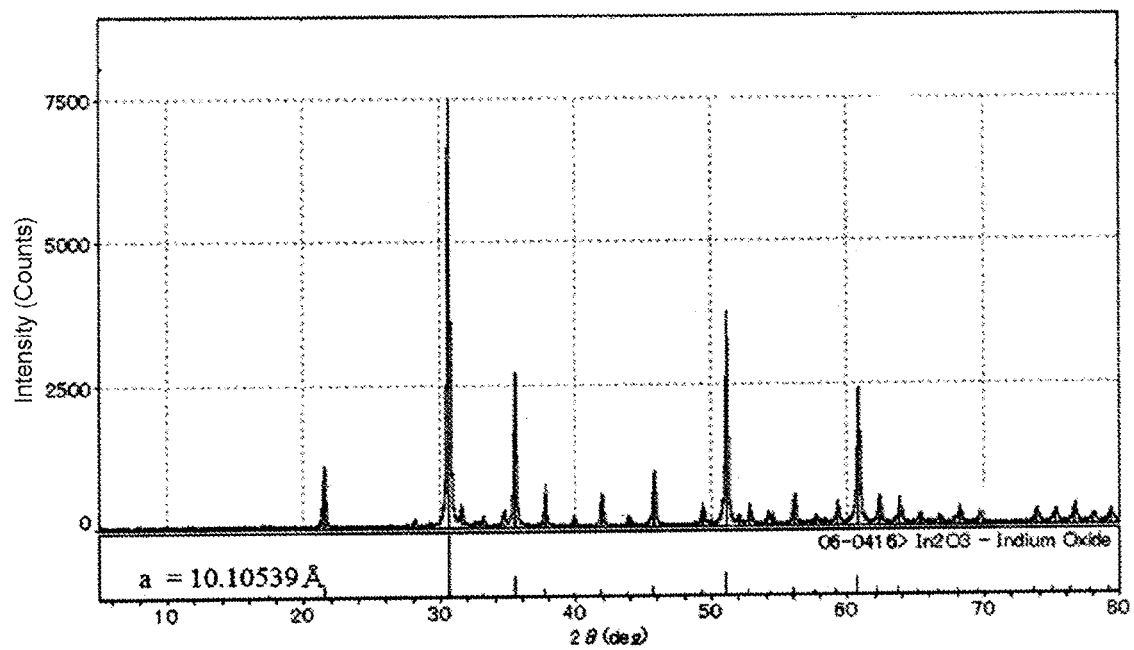
FIG. 8 is an X-ray diffraction pattern of an oxide sintered body in Example 6.
Figure 9:
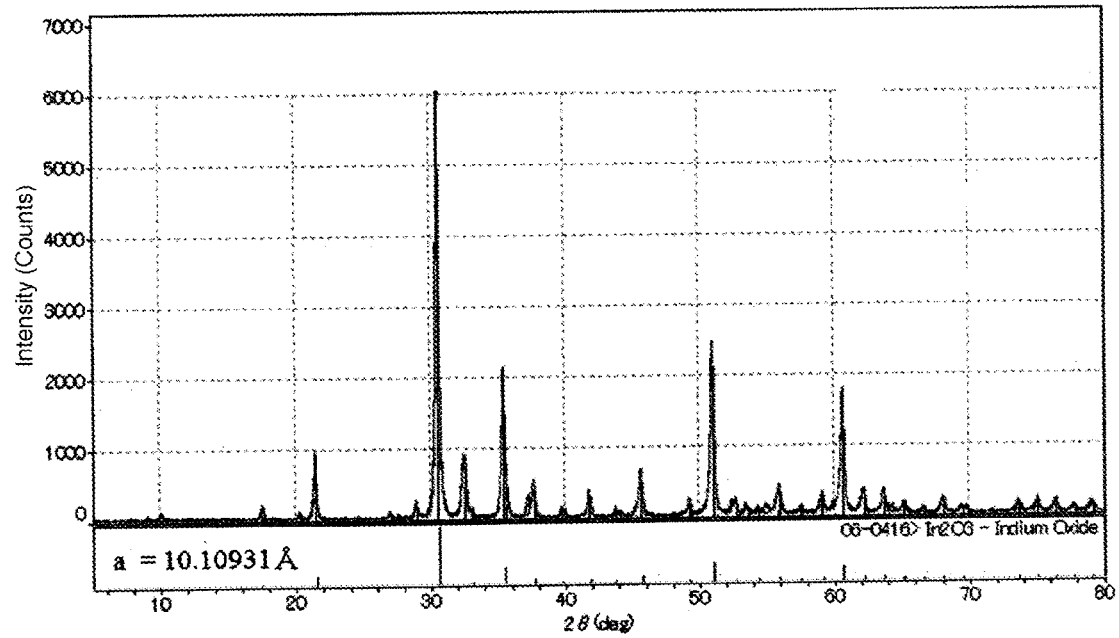
FIG. 9 is an X-ray diffraction pattern of an oxide sintered body in Example 7.
Figure 10:
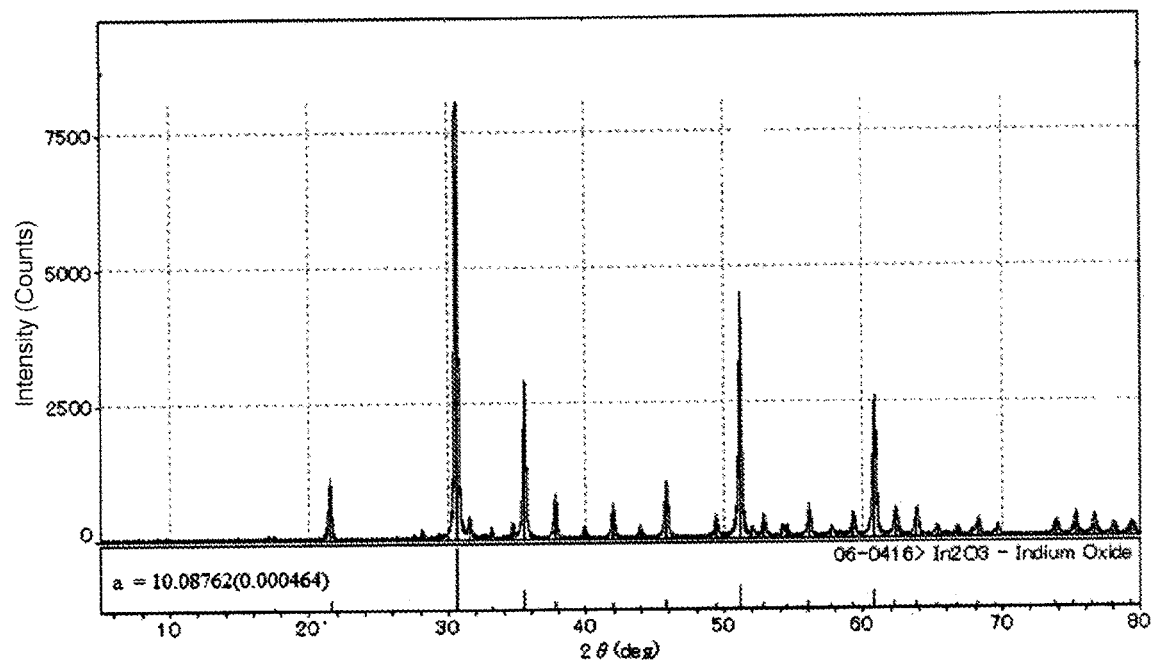
FIG. 10 is an X-ray diffraction pattern of an oxide sintered body in Example 8.

XRD charts of oxide sintered bodies obtained in Examples 6 to 8 are shown in FIGS. 8 to 10, respectively.

Further, bulk resistance (mΩ·cm) was measured on the oxide sintered body obtained by using Resistivity Meter LORESTA (made by Mitsubishi Chemical Corporation, LORESTA-AX MCP-T370) on the basis of a four-point probe array (JIS R 1637). The results are shown in Table 2.

A surface of the oxide sintered body obtained in Examples 6 to 8 was ground with a surface grinding machine in the order of Buff #40, #200, #400 and #1000, a lateral side was cut with a diamond cutter, and the resulting material was laminated onto a backing plate by using metal indium to prepare a sputtering target having a diameter of 4 inches.
(Evaluation of Characteristics of Sputtering Target)

(1) Warpage (mm) was measured, on the target obtained, according to a method described below. The results are shown in Table 2.

With regard to the warpage, a straight edge was applied onto a back surface of the backing plate, and a clearance was measured with a feeler gauge.

(2) A bonding ratio (%) was measured, on the target obtained, according to a method described below.

With regard to the bonding ratio, a void part which was not bonded was measured with ultrasonic testing equipment, and a ratio of a part which was bonded was measured on a target area basis. The results are shown in Table 2.

Substrate temperature during film formation: room temperature

In addition, no abnormal discharge was observed during sputtering.

(2) Heating Step

A laminate obtained was heated at a heating rate of 10° C./min in air, and held at a temperature of 350° C. for 120 minutes, and heat-treated.

(3) Formation of Protective Insulating Film

On a semiconductor thin film after heat treatment, a $SiO_2$ film (protective insulating film; an interlayer insulating film 70, a channel portion interlayer insulating film 70a (in this regard, a continuous film without contact holes at this time point)) was formed at a substrate temperature of 350° C. according to a chemical vapor deposition (CVD) method, and heat-treated in air at 350° C. for 60 minutes.

(4) Formation of Source-Drain Electrodes

On the $SiO_2$ film after heat treatment, the contact holes were formed, and as source-drain electrodes 50 and 60, molybdenum metal was attached thereto by using a metal mask according to sputter deposition, and then various heat treatments were performed to complete a thin film transistor (TFT), and characteristics of TFT as described below were evaluated.

TABLE 2

| | | Example 6 | Example 7 | Example 8 |
|---|---|---|---|---|
| Weight ratio of oxide (wt %) | Indium oxide | 86.5 | 84.5 | 92.0 |
| | Aluminum oxide | 3.0 | 5.0 | 0.0 |
| | Gallium oxide | 5.0 | 5.0 | 5.0 |
| | Samarium oxide | 5.0 | 5.0 | 3.0 |
| | Tin oxide | 0.5 | 0.5 | 0.0 |
| Metal atomic ratio in oxide sintered body (at %) | In/(In + Al + Ga + Sm + Sn) | 81.2 | 76.9 | 90.4 |
| | Al/(In + Al + Ga + Sm + Sn) | 7.7 | 12.4 | 0.0 |
| | Ga/(In + Al + Ga + Sm + Sn) | 7.0 | 6.7 | 7.3 |
| | Sm/(In + Al + Ga + Sm + Sn) | 3.7 | 3.6 | 2.3 |
| | Sn/(In + Al + Ga + Sm + Sn) | 0.4 | 0.4 | 0.0 |
| Characteristics of oxide sintered body | XRD data | FIG. 8 | FIG. 9 | FIG. 10 |
| | Crystalline phase in oxide sintered body (a = lattice constant Å) | $Sm_3In_2(AlGa)_3O_{12}$ + $In_2O_3$ (Al/Ga solid solution) | $Sm_3In_2(AlGa)_3O_{12}$ + $In_2O_3$ (Al/Ga solid solution) | $Sm_3In_2Ga_3O_{12}$ + $In_2O_3$ (Ga solid solution) |
| | $In_2O_3$ abundance ratio (wt %) | 94.2 | 90.8 | 94.6 |
| | Sintered density (g/cm³) | 6.89 | 6.77 | 6.98 |
| | Bulk resistance (mΩ · cm) | 3.68 | 3.9 | 2.6 |
| Target characteristics | Warpage of target (mm) | 0.05 | 0.00 | 0.00 |
| | Bonding ratio of target | 99.50 | 99.87 | 99.60 |

[Manufacture of Oxide Thin Film]

Example 9

Figure 11:
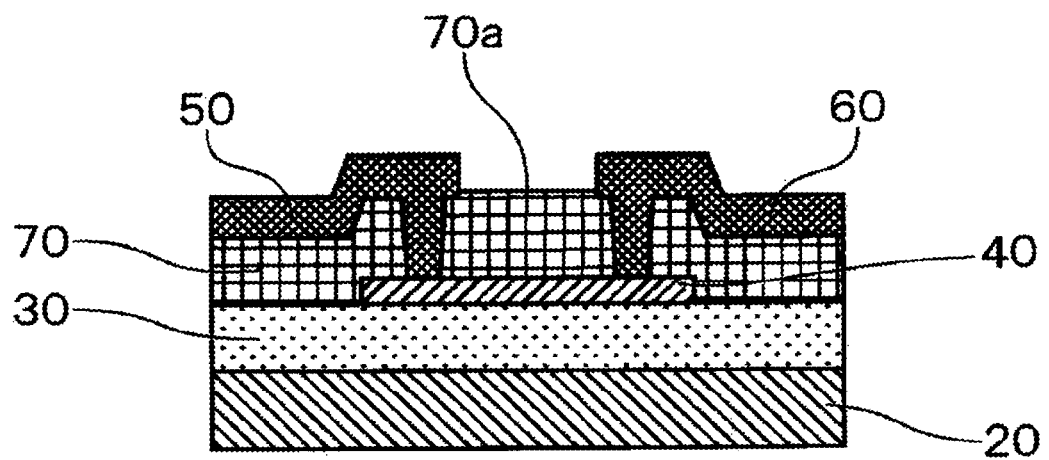
FIG. 11 is a schematic cross-sectional view showing a structure of a bottom gate type thin film transistor manufactured in Example 9.

A thin film transistor having a structure shown in FIG. 11 was manufactured according to the steps described below.
(1) Film Formation Step A 50 nm-thick thin film (oxide semiconductor layer 40) was formed on a silicon wafer (gate electrode 20) with a thermal oxide film (gate insulating film 30) through a metal mask according to sputtering by using the sputtering target manufactured in Example 8. As a sputtering gas, a mixed gas (impurity concentration: 0.01% by volume) of high purity argon and high purity oxygen was used, and sputtering was performed under the following film formation conditions.
Atmospheric gas: Ar+$O_2$
Oxygen partial pressure during film formation: 20%
Back pressure before film formation: $5.0 \times 10^{-4}$ Pa
Sputter pressure during film formation: 0.3 Pa <Evaluation of Characteristics of TFT>

The following characteristics of the TFT obtained were evaluated.

Saturation mobility was determined from transfer characteristics when 5 V was applied as drain voltage. Specifically, a graph of transfer characteristics Id-Vg was prepared, transconductance (Gm) at each Vg was calculated, and the saturation mobility was derived according to the equation for the linear region. In addition, Gm is represented by $\partial(Id)/\partial(Vg)$, Vg was applied in the range of −15 to 25 V, and maximum mobility in the range was defined as the saturation mobility. Unless otherwise noted in the invention, the saturation mobility was evaluated according to the above method. Id described above represents current between the source-drain electrodes, and Vg represents gate voltage when voltage Vd is applied between the source-drain electrodes.

The thus obtained saturation mobility of the TFT was 41.6 cm²/(V·sec).

Threshold voltage (Vth) was defined as Vg when Id=$10^{-9}$ A according to the graph of transfer characteristics.

The thus obtained threshold voltage of the TFT was −0.2 V.

As an on-off ratio, a value of Id when Vg=−10 V was taken as an Off current value, a value of Id when Vg=20 V was taken as an On current value, and a ratio [On/Off] was determined.

The thus obtained On/Off ratio of the TFT was greater than $10^8$, and the resulting Off current value was less than $10^{-12}$ A.

Examples 10 to 12

[Manufacture of Oxide Sintered Body]

An oxide sintered body was obtained by performing operation in the same methods as in Examples 1 to 5 by using neodymium oxide powder, indium oxide powder and gallium powder to be in a ratio shown in Table 3. Evaluation was also performed in the same manner as in Examples 1 to 5, and the results are shown in Table 3. An XRD chart in Example 10 show peaks which do not reside in JCPDS cards, and the oxide sintered body is considered to be a new compound, and was identified as $Nd_3In_2Ga_3O_{12}$ from an atomic composition ratio, comparison with similar XRD patterns and structural analysis of an XRD pattern obtained.

TABLE 3

Figure 12:
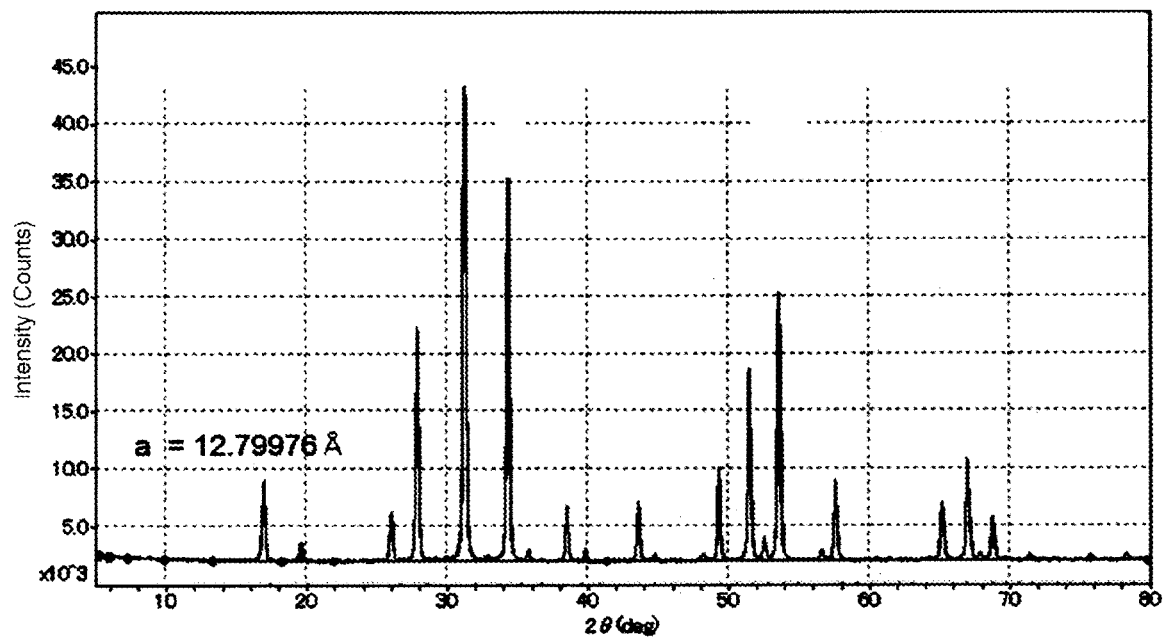
FIG. 12 is an X-ray diffraction pattern of an oxide sintered body in Example 10.
Figure 13:
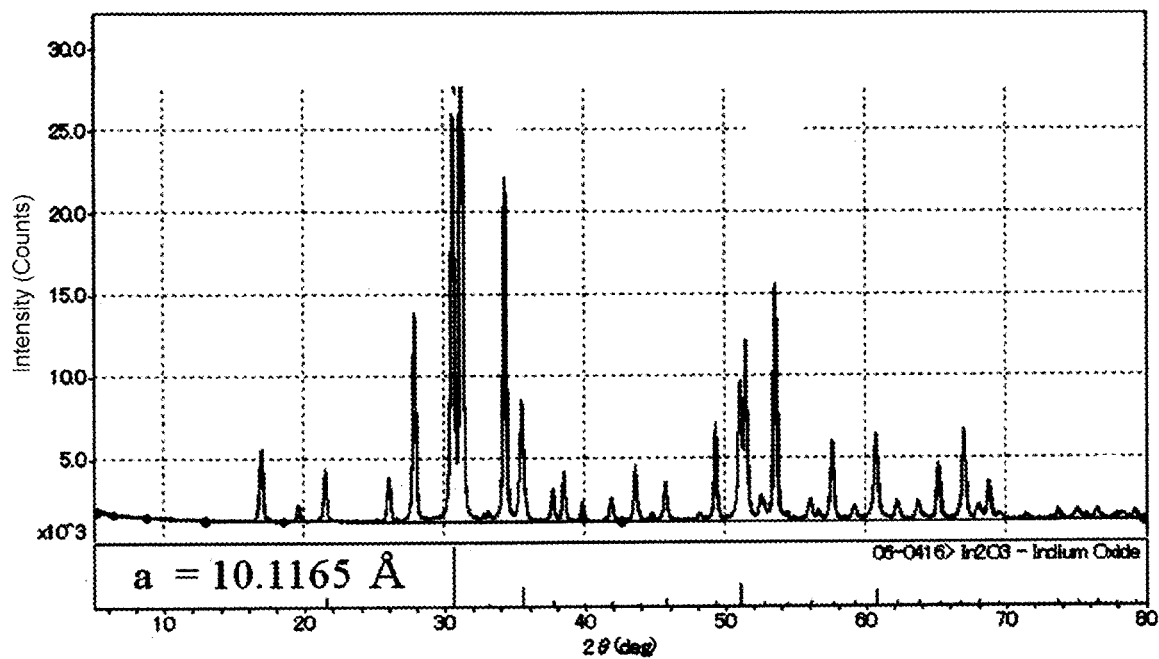
FIG. 13 is an X-ray diffraction pattern of an oxide sintered body in Example 11.
Figure 14:
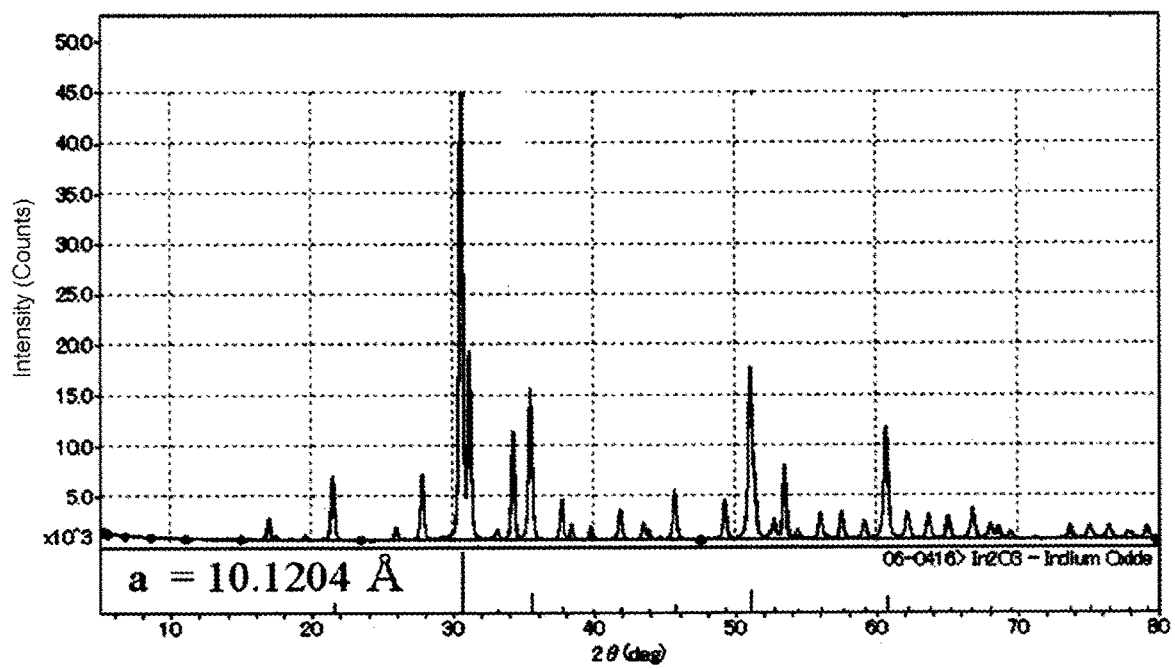
FIG. 14 is an X-ray diffraction pattern of an oxide sintered body in Example 12.

| | | Example 10 | Example 11 | Example 12 |
|---|---|---|---|---|
| Weight ratio of oxide (wt %) | Indium oxide | 26.1 | 51.4 | 76.0 |
| | Aluminum oxide | 0.0 | 0.0 | 0.0 |
| | Gallium oxide | 26.4 | 17.4 | 8.6 |
| | Neodymium oxide | 47.5 | 31.2 | 15.4 |
| | Tin oxide | 0.0 | 0.0 | 0.0 |
| Metal atomic ratio in oxide sintered body (at %) | In/(In + Al + Ga + Nd + Sn) | 25.0 | 50.0 | 74.9 |
| | Al/(In + Al + Ga + Nd + Sn) | 0.0 | 0.0 | 0.0 |
| | Ga/(In + Al + Ga + Nd + Sn) | 37.5 | 25.0 | 12.6 |
| | Nd/(In + Al + Ga + Nd + Sn) | 37.5 | 25.0 | 12.5 |
| | Sn/(In + Al + Ga + Nd + Sn) | 0.0 | 0.0 | 0.0 |
| Characteristics of oxide sintered body | XRD data | FIG. 12 | FIG. 13 | FIG. 14 |
| | Crystalline phase in oxide sintered body (a = lattice constant Å) | $Nd_3In_2Ga_3O_{12}$ (a = 12.79976 Å) | $Nd_3In_2Ga_3O_{12}$ + $In_2O_3$ | $Nd_3In_2Ga_3O_{12}$ + $In_2O_3$ |
| | $In_2O_3$ abundance ratio (wt %) | 0 | 37.7 | 70.9 |
| | Sintered density (g/cm³) | 4.98 | 5.45 | 6.37 |

INDUSTRIAL APPLICABILITY

An oxide sintered body of the invention can be utilized for a sputtering target, and is useful for manufacture of an oxide semiconductor thin film of a thin film transistor (TFT) used for a display unit or the like such as a liquid crystal display and an organic EL display.

Several embodiments and/or Examples of the invention have been described in detail above, but those skilled in the art will readily make a great number of modifications to the exemplary embodiments and/or Examples without substantially departing from new teachings and advantageous effects of the invention. Accordingly, all such modifications are included within the scope of the invention.

The entire contents of the description of the Japanese application serving as a basis of claiming the priority concerning the present application to the Paris Convention are incorporated by reference herein.

The invention claimed is:

1. A sputtering target, comprising a oxide sintered body, comprising:

a garnet phase represented by a general formula (I):

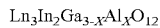

$$Ln_3In_2Ga_{3-X}Al_XO_{12} \quad (I)$$

wherein,

Ln represents one or more metal elements selected from Nd and Sm satisfies an expression 0≤X<3, and a bixbyite phase represented by $In_2O_3$.

2. The sputtering target according to claim 1, wherein Ln includes either of Nd or Sm.

3. The sputtering target according to claim 1, wherein the oxide sintered body has an atomic ratio (Ga+Al)/(In+Ln+Ga+Al) when Al is included therein of 0.01 or more and 0.20 or less.

4. The sputtering target according to claim 1, wherein the oxide sintered body has an atomic ratio Ga/(In+Ln+Ga) when Al is not included therein of 0.01 or more and 0.40 or less.

5. The sputtering target according to claim 1, wherein the oxide sintered body has an atomic ratio Ln/(In+Ln+Ga+Al) of 0.02 or more and 0.20 or less.

6. The sputtering target according to claim 1 wherein the sintered density of the oxide sintered body is within the range of 6.5 to 7.1 g/cm³.

7. The sputtering target according to claim 1 wherein the bulk resistance of the oxide sintered body is 30 mΩ·cm or less.

8. The sputtering target according to claim 1 wherein the three point flexural strength of the oxide sintered body is 120 MPa or more.

9. The sputtering target according to claim 1 wherein the coefficient of linear expansion of the oxide sintered body is $8.0 \times 10^{-6}$ $K^{-1}$ or less.

10. The sputtering target according to claim 1 wherein the thermal conductivity of the oxide sintered body is 5.0 W/m·K or more.

* * * * *